US009633835B2

(12) United States Patent
Glass et al.

(10) Patent No.: US 9,633,835 B2
(45) Date of Patent: Apr. 25, 2017

(54) TRANSISTOR FABRICATION TECHNIQUE INCLUDING SACRIFICIAL PROTECTIVE LAYER FOR SOURCE/DRAIN AT CONTACT LOCATION

(71) Applicant: Intel Corporation, Santa Clara, CA (US)

(72) Inventors: Glenn A. Glass, Beaverton, OR (US); Anand S. Murthy, Portland, OR (US); Michael J. Jackson, Portland, OR (US); Michael L. Hattendorf, Portland, OR (US); Subhash M. Joshi, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 209 days.

(21) Appl. No.: 14/020,299

(22) Filed: Sep. 6, 2013

(65) Prior Publication Data

US 2015/0069473 A1 Mar. 12, 2015

(51) Int. Cl.

| H01L 21/02 | (2006.01) |
|---|---|
| H01L 21/768 | (2006.01) |
| H01L 21/306 | (2006.01) |
| H01L 29/78 | (2006.01) |
| H01L 29/417 | (2006.01) |
| H01L 29/66 | (2006.01) |

(52) U.S. Cl.
CPC .. *H01L 21/02175* (2013.01); *H01L 21/30604* (2013.01); *H01L 21/76805* (2013.01); *H01L 21/76897* (2013.01); *H01L 29/41791* (2013.01); *H01L 29/66795* (2013.01); *H01L 29/785* (2013.01); *H01L 29/66545* (2013.01)

(58) Field of Classification Search
CPC ............. H01L 29/785; H01L 21/02175; H01L 21/76805; H01L 21/30604; H01L 29/66795; H01L 29/41791; H01L 29/66545; H01L 21/76897
See application file for complete search history.

(56) References Cited

U.S. PATENT DOCUMENTS

| 5,874,341 A | * | 2/1999 | Gardner ............ H01L 21/28114 257/E21.205 |
|---|---|---|---|
| 2009/0321820 A1 | * | 12/2009 | Yamakawa .................... 257/330 |
| 2009/0321837 A1 | * | 12/2009 | Wei et al. ...................... 257/368 |

(Continued)

*Primary Examiner* — Yu Chen
*Assistant Examiner* — Nilufa Rahim
(74) *Attorney, Agent, or Firm* — Finch & Maloney PLLC

(57) ABSTRACT

Techniques are disclosed for transistor fabrication including a sacrificial protective layer for source/drain (S/D) regions to minimize contact resistance. The sacrificial protective layer may be selectively deposited on S/D regions after such regions have been formed, but prior to the deposition of an insulator layer on the S/D regions. Subsequently, after contact trench etch is performed, an additional etch process may be performed to remove the sacrificial protective layer and expose a clean S/D surface. Thus, the sacrificial protective layer can protect the contact locations of the S/D regions from contamination (e.g., oxidation or nitridation) caused by insulator layer deposition. The sacrificial protective layer can also protect the S/D regions from undesired insulator material remaining on the S/D contact surface, particularly for non-planar transistor structures (e.g., finned or nanowire/nanoribbon transistor structures).

19 Claims, 11 Drawing Sheets

(56) References Cited

U.S. PATENT DOCUMENTS

| | | | |
|---|---|---|---|
| 2012/0119302 A1* | 5/2012 | Pei et al. | 257/382 |
| 2012/0315760 A1* | 12/2012 | Yu et al. | 438/682 |
| 2013/0168749 A1* | 7/2013 | Fan et al. | 257/288 |
| 2013/0187203 A1* | 7/2013 | Xie et al. | 257/288 |
| 2013/0330924 A1* | 12/2013 | Olsen et al. | 438/667 |
| 2014/0217480 A1* | 8/2014 | Kronholz et al. | 257/288 |
| 2014/0256109 A1* | 9/2014 | Yin et al. | 438/300 |
| 2014/0264482 A1* | 9/2014 | Li et al. | 257/288 |
| 2014/0273385 A1* | 9/2014 | Liang | H01L 21/28008 438/299 |
| 2014/0306291 A1* | 10/2014 | Alptekin | H01L 29/41725 257/369 |
| 2014/0374827 A1* | 12/2014 | Suh et al. | 257/347 |
| 2016/0163861 A1* | 6/2016 | Park | H01L 21/823425 257/192 |

\* cited by examiner

TRANSISTOR FABRICATION TECHNIQUE INCLUDING SACRIFICIAL PROTECTIVE LAYER FOR SOURCE/DRAIN AT CONTACT LOCATION

BACKGROUND

Increased performance of circuit devices including transistors, diodes, resistors, capacitors, and other passive and active electronic devices formed on a semiconductor substrate, is typically a major factor considered during design, manufacture, and operation of those devices. For example, during the design and fabrication or forming of transistors (e.g., transistors having a planar, finned, or nanowire/nanoribbon configuration), it is often desired to minimize resistance at source and drain (S/D) contact locations, because resistance can lead to poor electrical conduction and can decrease transistor performance.

DETAILED DESCRIPTION

Figure 1:
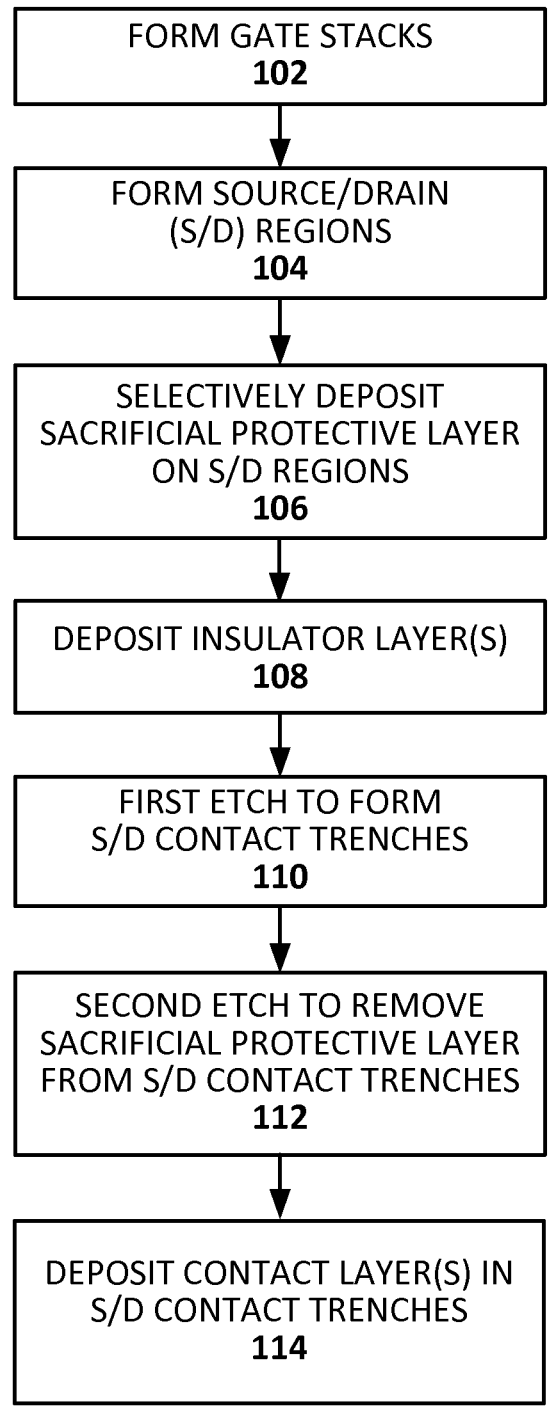
FIG. 1 is a method for transistor fabrication including a sacrificial protective layer at the contact location of the source/drain regions, in accordance with one or more embodiments of the present disclosure.

Techniques are disclosed for transistor fabrication including a sacrificial protective layer for source/drain (S/D) regions to minimize contact resistance. The sacrificial protective layer may be selectively deposited on S/D regions after such regions have been formed, but prior to the deposition of an insulator layer on the S/D regions. Subsequently, after contact trench etch is performed, an additional etch process may be performed to remove the sacrificial protective layer and expose a clean S/D surface. Thus, the sacrificial protective layer can protect the contact locations of the S/D regions from contamination (e.g., oxidation or nitridation) caused by insulator layer deposition. The sacrificial protective layer can also protect the S/D regions from undesired insulator material remaining on the S/D contact surface, particularly for non-planar transistor structures (e.g., finned or nanowire/nanoribbon transistor structures). In general, the sacrificial protective layer can be any suitable material having high etch rate capability in chemistry that does not remove (or otherwise has a negligible impact on) the S/D material and insulator layers. One example embodiment uses a sacrificial protective layer of germanium (Ge), which can be selectively etched away with ozonated water or peroxide. Numerous variations will be apparent in light of this disclosure.

General Overview

As previously explained, increased resistance at source and drain (S/D) contact locations can lead to poor electrical conduction. Resistance may be increased by contamination of the S/D layer during transistor fabrication or formation. For example, contamination may occur when insulating layers (e.g., SiN, SiO, SiOCN, etc.) are deposited on the S/D region during the fabrication of the transistor. Such contamination may include oxidation or nitridation of the surface or exposed layer of the S/D regions. Further, the S/D may be damaged during the deposition of the insulator layer, since it typically involves PECVD, CVD, and/or ALD in strongly oxidizing conditions and/or heavy ion bombardment. In addition, and with respect to non-planar transistor structures, such as FinFETs and nanowire/nanoribbon devices, unwanted insulator material may remain on the sidewalls of the S/D regions after contact trench etch has been performed. Damage to the S/D layers, unintended insulator material remaining on the S/D layers, and/or other contamination at the contact locations of S/D regions can prevent good electrical contact between the S/D layers and subsequent contact layers deposited thereon, which decreases or otherwise inhibits transistor performance.

Thus, and in accordance with one or more embodiments of the techniques disclosed herein, transistor fabrication including a sacrificial protective layer at the contact locations of S/D regions may be used to minimize contact resistance. In some embodiments, the sacrificial protective layer may be selectively deposited on S/D regions after such regions have been formed, but prior to the deposition of one or more insulator layers on the S/D regions. In such embodiments, the sacrificial protective layer may prevent contamination and other undesired effects caused by the subsequent deposition of insulation layers over the S/D regions, such as oxidation and nitridation. In the case of non-planar transistor structures, the sacrificial protective layer can be used to prevent undesired insulator from remaining on non-horizontal surfaces of the S/D regions. For example, use of a sacrificial protective layer can prevent undesired insulator from remaining on the sidewalls of S/D regions in the case of finned or nanowire/nanoribbon transistor structures, as will be discussed in turn.

The sacrificial protective layer can be removed via a selective etch process after contact trench etch has been performed, so as to remove the sacrificial protective layer from the exposed contact locations of the S/D regions. In some embodiments, the sacrificial protective layer may include any suitable material that has a high etch rate capability in chemistry that does not significantly remove S/D material or insulator layers material. The high etch rate capability of the sacrificial layer may be, for example, at least 3×, 5×, 8×, 10×, 12×, or 15× the etch rate of adjacent material, or some other suitable relative high etch rate. Such material may also be capable of depositing selectively on S/D layers but not on insulator surfaces. For example, the sacrificial protective layer material may be amorphous or crystalline germanium (Ge), which can be removed using an ozonated water rinse or peroxide as the etchant. In other embodiments, the sacrificial protective layer may be non-selectively deposited, and may include materials such as titanium (Ti) or cobalt (Co), which can be selectively etched with a strong sulfuric acid, or boron nitride (BN) or spin-on carbon hardmask (CHM), which can be selectively etched with ash followed by a sulfuric clean. Other suitable sacrificial protective layer materials and corresponding etchants will be apparent in light of this disclosure. Note that the same sacrificial protective layer can be deposited on both p-type and n-type S/D regions. Therefore, the sacrificial protective layer as variously described herein can be used during the fabrication of planar and non-planar semiconductor devices including p-type and/or n-type S/D regions (e.g., for a complementary metal-oxide-semiconductor (CMOS) device).

After the etch to remove the sacrificial protective layer has been performed, a S/D contact surface is exposed that is uncontaminated and lacks undesired remaining insulator. Subsequent deposition of a contact layer (e.g., contact metals with or without annealing) on the clean S/D contact surface enables the contact layer to form a low resistance junction. In the case of non-planar transistor structures, where the contact layer can be deposited on fin sidewalls or around nanowires/nanoribbons in the S/D region, the increased effective contact area provides better electrical contact between the S/D layer and the contact layer. Further, the increased effective contact area that is attained (and thus the higher gain realized) from using a sacrificial protective layer during transistor fabrication improves as fin height is increased or as more layers of nanowires/nanoribbons are used.

As will be appreciated, the selective etch performed to remove the sacrificial protective layer only removes the layer from the exposed contact trench areas. However, the sacrificial protective layer still remains under the one or more insulator layers that were subsequently deposited in the S/D regions that were not opened by contact trench etch. Upon analysis (e.g., scanning electron microscopy and/or composition mapping), a structure configured in accordance with one embodiment will effectively show a sacrificial protective layer in the S/D regions that were not opened by contact trench etch, but the areas that were opened by contact trench etch will not have the sacrificial protective layer material present. Further, in some cases, transistors fabricated using a sacrificial protective layer will exhibit contact resistance that is lower than the contact resistance of transistors made without using a such a layer.

Thus, transistor structures configured in accordance with one embodiment of the present disclosure provides an improvement over conventional structures with respect to, at least, lower contact resistance at the S/D regions. In some embodiments, there may be a 2× reduction in contact resistance. Further, in some embodiments, there may be a transistor current improvement of at least 15% for p and/or n devices using a sacrificial protective layer as variously described herein. Any number of semiconductor devices or circuitry having a need for high performance contacts can benefit from using a sacrificial protective layer during transistor fabrication as variously described herein. Numerous configurations and variations will be apparent in light of this disclosure.

Methodology and Architecture

FIG. 1 is a method for transistor fabrication including a sacrificial protective layer at the contact location of the source/drain regions, in accordance with one or more embodiments. FIGS. 2A-F illustrate example structures that are formed as the method of FIG. 1 is carried out for a planar, tri-gate, non-planar, or FinFET transistor architecture, in accordance with one or more embodiments. For tri-gate or FinFET embodiments, FIGS. 2A-F illustrate a cross-sectional view taken along the length of the semiconductor fin.

Figure 2A:
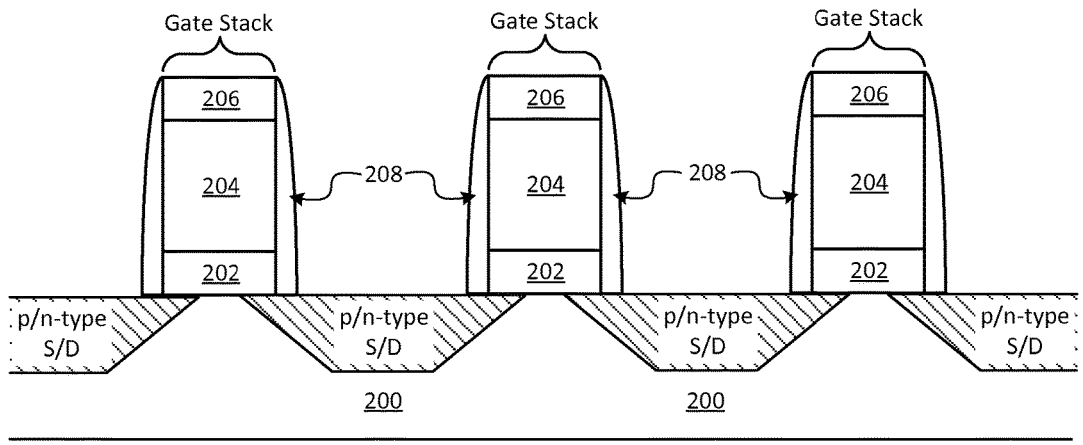
FIGS. 2A-F illustrate example structures that are formed as the method of FIG. 1 is carried out for a planar transistor architecture, in accordance with one or more embodiments.

The example method includes forming 102 one or more gate stacks on a semiconductor substrate upon which a MOS device may be formed. FIG. 2A shows an example resulting structure, which in this case includes either NMOS or PMOS transistors formed on a substrate 200 (e.g., a planar substrate or a semiconductor fin). In some embodiments, both NMOS and PMOS transistors may be formed on the substrate 200 (e.g., for CMOS devices). In such embodiments, the n-type and p-type regions may be separated by a shallow trench isolation (STI) or some other suitable form of isolation. As can be seen, each gate stack is formed over a channel region of a transistor, and includes a gate dielectric layer 202, a gate electrode 204, and an optional hardmask 206, as well as sidewall spacers 208 formed adjacent to the gate stacks.

Any number of suitable substrates can be used to implement substrate 200, including bulk substrates, semiconductors-on-insulator substrates (XOI, where X is a semiconductor material such as silicon, germanium, or germanium-enriched silicon), and multi-layered structures, including those substrates upon which fins or nanowires/nanoribbons are formed prior to a subsequent gate patterning process (e.g., as will be discussed in more detail below with reference to FIGS. 3A-E'). In some specific example cases, the substrate 200 is a germanium or silicon or SiGe bulk substrate, or a germanium or silicon or SiGe on oxide substrate. Although a few examples of materials from which the substrate 200 may be formed are described here, any material that may serve as a foundation upon which a low contact resistance semiconductor device may be built falls within the spirit and scope of the present disclosure.

The gate dielectric 202 can be, for example, any suitable oxide such as silicon dioxide ($SiO_2$) or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 202 to improve its quality when a high-k material is used. In some specific example embodiments, the high-k gate dielectric layer 202 may have a thickness in the range of 5 Å to around 100 Å thick (e.g., 10 Å). In other embodiments, the gate dielectric layer 202 may have a thickness of one monolayer of oxide material. In general, the thickness of the gate dielectric layer 202 should be sufficient to electrically isolate the gate electrode 204 from the source and drain contacts. In some embodiments, additional processing may be performed on the high-k gate dielectric layer 202, such as an annealing process to improve the quality of the high-k material.

The gate electrode 204 material can be, for example, polysilicon, silicon nitride, silicon carbide, or a metal layer (e.g., tungsten, titanium nitride, tantalum, tantalum nitride), although other suitable gate electrode materials can be used as well. The gate electrode 204 material, which may be a sacrificial material that is later removed for a replacement metal gate (RMG) process, may have a thickness in the range of 10 Å to 500 Å (e.g., 100 Å), in some example embodiments. The optional gate hard mask layer 206 can be used to provide certain benefits or uses during processing, such as protecting the gate electrode 304 from subsequent etch and/or ion implantation processes. The hard mask layer 206 may be formed using typical hard mask materials, such as silicon dioxide, silicon nitride, and/or other conventional insulator materials.

The gate stack can be formed as conventionally done or using any suitable custom techniques (e.g., conventional patterning process to etch away portions of the gate electrode and the gate dielectric layers to form the gate stack, as shown in FIG. 2A). Each of the gate dielectric 202 and gate electrode 204 materials may be formed, for example, using conventional deposition processes such as chemical vapor deposition (CVD), atomic layer deposition (ALD), spin-on deposition (SOD), or physical vapor deposition (PVD). Alternate deposition techniques may be used as well, for instance, the gate dielectric 202 and gate electrode 204 materials may be thermally grown. As will be appreciated in light of this disclosure, any number of other suitable materials, geometries, and formation processes can be used to implement an embodiment, so as to provide a low contact resistance transistor device or structure as described herein. The sidewall spacers 208 may be formed, for example, using conventional materials such as silicon oxide, silicon nitride, or other suitable spacer materials. The width of the spacers 208 may generally be chosen based on design requirements for the transistor being formed. In accordance with some embodiments, however, the width of the spacers 208 may not be subject to design constraints imposed by the formation of the source and drain epi-tips, given sufficiently high boron doped germanium content in the S/D tip regions.

With further reference to FIG. 1, after the one or more gate stacks are formed, the method continues with forming 104 (or defining) the S/D regions of the transistor structure. The S/D regions can be implemented with any number of suitable processes and configurations. For example, the S/D regions may be implanted, etched and epi filled, raised, silicon or germanium or SiGe alloy, p-type and/or n-type, and have a planar or fin or wire shaped diffusion region. For instance, in some such example cases, the source and drain regions can be formed using either an implantation/diffusion process or an etching/deposition process. In the former process, dopants such as boron, aluminum, antimony, phosphorous, or arsenic may be ion-implanted into the substrate 200 to form the source and drain regions. The ion implantation process is typically followed by an annealing process that activates the dopants and may also cause them to diffuse further into the substrate 200. In the latter process, the substrate 200 may first be etched to form recesses at the locations of the source and drain regions. An epitaxial deposition process may then be carried out to fill the recesses with silicon or a silicon alloy, such as a silicon germanium or silicon carbon alloy, thereby forming the source and drain regions. In some implementations the epitaxially deposited silicon alloy may be doped in-situ or ex-situ with dopants such as boron, arsenic, or phosphorous, for example.

In the example embodiment shown in FIG. 2A, substrate 200 has been etched to provide cavities as well as respective tip areas which undercut the gate dielectric 202. The cavities and tip areas have been filled to provide the S/D regions and the optional tip regions. In accordance with some specific example embodiments where the substrate 200 is a silicon bulk or silicon-on-insulator (SOI) substrate, the source and drain cavities along with their respective tip areas are filled with in-situ doped silicon or SiGe or germanium thereby forming the source and drain regions (along with their respective epi-tip). Any number of S/D region configurations can be used, with respect to materials (e.g., doped or undoped Si, Ge, SiGe), dopant (e.g., boron, arsenic, or phosphorous), and geometries (e.g., thickness of S/D layer may range, for instance, from 50 to 500 nm so as to provide flush or raised or finned S/D regions). In the example embodiment shown in FIG. 2A, the transistor has a planar configuration with flush S/D regions. In other embodiments, the transistor may have a finned or nanowire/nanoribbon configuration, resulting in raised S/D regions, as will be discussed below with reference to FIGS. 3A-E'.

As will be appreciated in light of this disclosure, any number of other transistor features may be implemented with an embodiment. For instance, the channel may be strained or unstrained, and the S/D regions may or may not include tip regions formed in the area between the corresponding S/D region and the channel region. In this sense, whether a transistor structure has strained or unstrained channels, or source-drain tip regions or no source-drain tip regions, is not particularly relevant to all embodiments, and the present disclosure is not intended to be limited to any particular such structural features. Rather, any number of transistor structures and types, and particularly those structures having finned or gate-all-around transistor configurations, can benefit from using a sacrificial protective layer for the contact locations of the source drain regions as variously described herein.

Figure 2B:
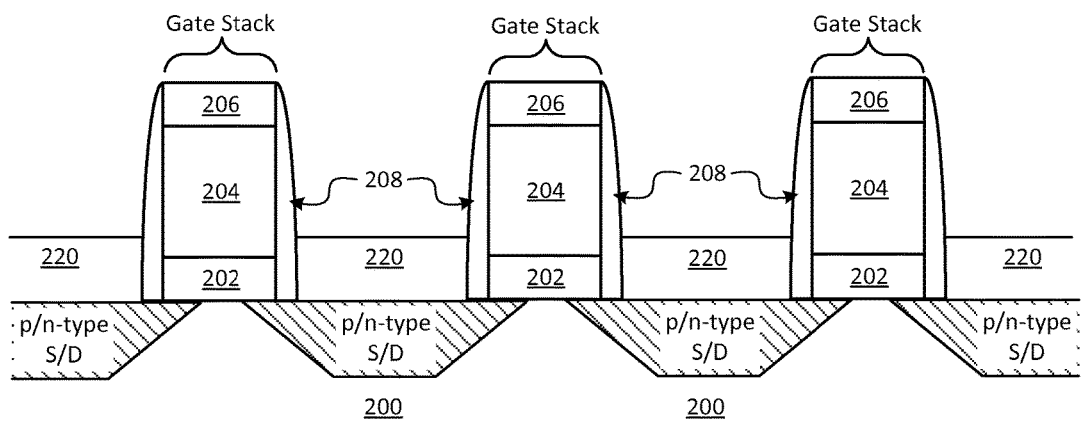

With further reference to FIG. 1, after the S/D regions are formed (or defined), the method of this example embodiment continues with selectively depositing 106 a sacrificial protective layer over the S/D regions. For example, as shown in FIG. 2B, the sacrificial protective layer 220 is selectively deposited on the S/D regions, between sidewall spacers 208. As will be appreciated in light of this disclosure, the selectivity at which the sacrificial protective layer 220 is deposited can vary as desired (e.g., using any number of masking/patterning techniques). In some cases, for instance, the sacrificial protective layer 220 may be deposited on only a portion of the S/D regions. In other cases, the sacrificial protective layer may be deposited over the entirety of the S/D regions (as is the case in FIG. 2B). In yet other cases, the sacrificial protective layer may be non-selectively deposited on all surfaces. As previously described, the sacrificial protective layer 220 is deposited prior to subsequent deposition 108 of the insulator layer(s) to help prevent oxidation or nitridation, or other contamination or damage to the S/D regions. In this manner, and in accordance with an embodiment, etching to expose the S/D layers to allow for deposition of one or more subsequent contact layers is a two-part process, that includes a first etch 110 to form the S/D contact trenches and a second etch 112 to remove the sacrificial protective layer 220 from the contact trenches, both of which will be discussed in more detail below.

In one or more embodiments, the sacrificial protective layer 220 may include any material that has a high etch rate capability in chemistry that does not significantly remove S/D material or insulator layers material. The sacrificial protective layer 220 may also be capable of depositing selectively on S/D layers but not on insulator surfaces. The high etch rate capability of the sacrificial layer may be, for example, at least 3×, 5×, 8×, 10×, 12×, or 15× the etch rate of adjacent material, or some other suitable relative high etch rate. The relatively higher etch rate of the sacrificial protective layer may depend upon the sacrificial protective layer material, the etchant/selective etch process being used, and/or the material of adjacent layers (e.g., insulating layers).

In some example cases, the sacrificial protective layer material may include amorphous or crystalline germanium (Ge). In such cases, the corresponding etchant may include ozonated water or peroxide, or any other suitable etchant/etchant process selective for germanium. In other cases, the sacrificial protective layer material may be deposited via non-selective processes and include titanium (Ti), cobalt (Co), and/or aluminum oxide ($Al_2O_3$). In such cases, the corresponding etchant may include strong sulfuric acid, or any other suitable etchant/etchant process selective for the listed materials. In still other cases, the sacrificial protective layer material may include boron nitride (BN) and/or or spin-on carbon hardmask (CHM). In such cases, the corresponding etchant process may include an ash process that may or may not be followed by an optional sulfuric clean, or any other suitable etchant/etchant process selective for the listed materials. Numerous different materials may be used for the sacrificial protective layer, and such materials may be etched using any suitable etchant or selective etchant process, as will be apparent in light of this disclosure.

In one or more embodiments, the sacrificial protective layer 220 may be selectively deposited 106 using a chemical vapor deposition (CVD) technique or any other suitable technique. For example, deposition 106 of the sacrificial protective layer may be carried out using an ultra-high vacuum CVD (UHV-CVD), rapid thermal CVD (RT-CVD), low pressure CVD (LP-CVD), or gas source molecular beam epitaxy (GS-MBE). The basic deposition of the sacrificial protective layer 220 may be possible over a wide range of conditions. Deposition temperatures, pressures, flow rates, carrier gases, etc. may be selected based on the material(s) of the sacrificial protective layer 220 being deposited. In one specific example embodiment, an amorphous germanium sacrificial protective layer may be deposited using Ge at a flow rate of 100 standard cubic centimeters per minute (sccm), a pressure of 500 mTorr, and a temperature of 300° C. using a hydrogen ($H_2$) carrier gas. In some example embodiments, the sacrificial protective layer may have a thickness of 50 Å or less (e.g., the vertical height of sacrificial protective layer 220 shown in FIG. 2B represents the thickness). In such embodiments, the thickness of the sacrificial protective layer may be selected to minimize interference with other structures. Sacrificial protective layer thicknesses up to 500 Å, may be useful in some applications, such as for planar transistor configurations, for example. In non-planar transistor configurations, the thickness of the sacrificial protective layer may depend upon the height of the S/D regions, as will be discussed in more detail below. However, any suitable thickness may be selected for the sacrificial protective layer.

Figure 2C:
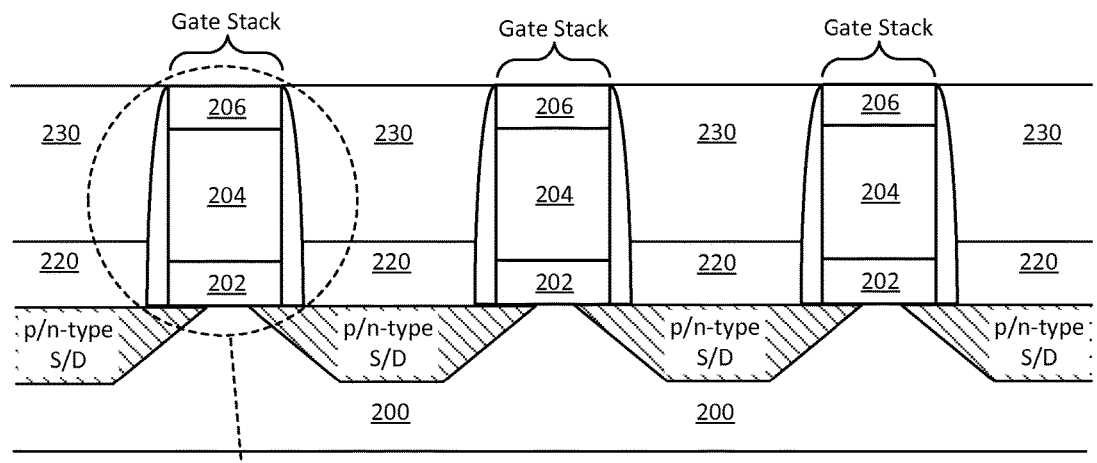
Figure 2C:
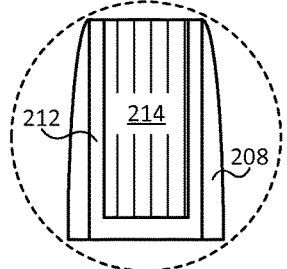

The method of FIG. 1 continues with depositing 108 one or more insulator layers. FIG. 2C shows a single insulator layer 230, which is deposited on sacrificial protective layer 220 and is flush with hard mask 206 in this example embodiment. However, more than one insulator layer may be deposited during 108 and the insulator layer(s) can be configured in a number of ways. In some embodiments, insulator layer 230 may be implemented with silicon oxides (SiO), silicon nitrides (SiN), carbon containing silicon nitride materials (SiCN), silicon carbides (SiC), silicon oxynitrides (SiON), carbon containing silicon oxynitrides materials (SiOCN), carbon containing silicon nitride materials (SiCN), or a combination thereof. In a more general sense, the material and dielectric constant of insulator layer materials can be selected as desired. In some embodiments, insulator layer 230 may include a liner (e.g., silicon nitride) followed by one or more layers of $SiO_2$, or any combination of nitride, oxide, oxynitride, carbide, oxycarbide, or other suitable electrically insulating materials. In a more general sense, insulator layer 230 may be any material having an etch rate for a given chemistry that is much slower (e.g., 3× or more slower) than the etch rate of the sacrificial protective layer 220 for that particular chemistry.

Insulator layer 230, which may be referred to as an interlayer dielectric (ILD), may be planarized as commonly done (e.g., by way of a post-deposition planarization process, such as chemical mechanical planarization (CMP)). Other example insulator materials that can be used to form insulator layer 230 include, for instance, carbon doped oxide (CDO), organic polymers such as perfluorocyclobutane (PFCB) or polytetrafluoroethylene (PTFE), fluorosilicate glass (FSG), and organosilicates such as silsesquioxane, siloxane, or organosilicate glass. Insulator layer 230 may be deposited on the sacrificial protective layer 220 using CVD, plasma-enhanced CVD (PECVD), atomic layer deposition (ALD), or any other suitable deposition techniques. As previously described, techniques used to deposit the one or more insulator materials typically include conditions (such as strongly oxidizing conditions and/or heavy ion bombardment), which can cause oxidation, nitridation, or other contamination/damage to layers immediately below the insulator layer. To this end, sacrificial protective layer 220 covers layers below it (e.g., S/D layers) to protect them from the damaging conditions associated with the deposition 108 of one or more insulator layers, as will be apparent in light of this disclosure.

As will be appreciated in light of this disclosure, and in accordance with some embodiments where a replacement metal gate (RMG) process is used, the method may further include removing the gate stack (including the high-k gate dielectric layer 202, the sacrificial gate electrode 204, and the hard mask layer 206) using an etching process as conventionally done. In some such cases, only the sacrificial gate 204 and hard mask layer 206 are removed. If the gate dielectric layer 202 is removed, the method may continue with depositing a new gate dielectric layer into the trench opening. Any suitable gate dielectric materials such as those previously described may be used here, such as hafnium oxide. The same deposition processes may also be used. Replacement of the gate dielectric layer may be used, for example, to address any damage that may have occurred to the original gate dielectric layer during application of the dry and wet etch processes, and/or to replace a low-k or sacrificial dielectric material with a high-k or otherwise desired gate dielectric material.

In such RMG processes, the method may further include depositing the gate electrode layer into the trench and over the gate dielectric layer. Conventional deposition processes may be used to form the replacement gate electrode, such as CVD, ALD, and PVD. The gate electrode layer may include, for example, a p-type work function metal, such as ruthenium, palladium, platinum, cobalt, nickel, and conductive metal oxides, e.g., ruthenium oxide. In some example configurations, two or more metal gate electrode layers may be deposited. For instance, a work function metal may be deposited in the gate trench followed by a suitable metal gate electrode fill metal such as aluminum or silver. FIG. 2C' shows an example gate structure resulting from such an optional RMG process, which includes a replacement gate electrode layer 214 over a replacement gate dielectric layer 212. Still in other embodiments, such RMG processing can take place later in the method (e.g., after deposition 114), so that the replacement gate materials will not be subjected to the processing associated with 106 through 114 of FIG. 1, for example. Therefore, in some embodiments, the S/D regions may be formed (or defined) 104 before the gate stacks are formed 102.

Figure 2D:
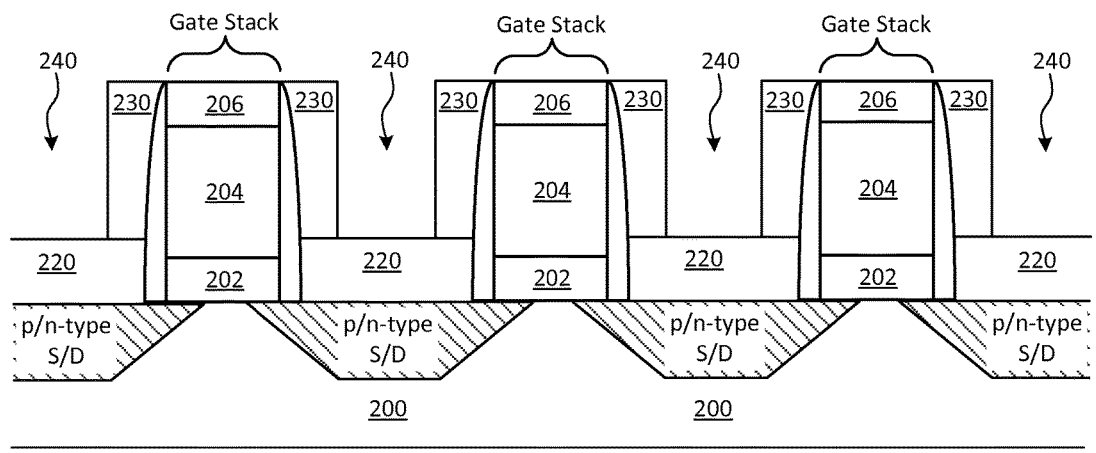

With further reference to FIG. 1, after insulator layer 230 has been deposited 108, the method continues with a first etch 110 to remove insulator layer 230 and form the S/D contact trenches. Any suitable patterning techniques and dry and/or wet etch processes can be used. In some cases, one or more etch stop layers may have been deposited during deposition 108, which may assist the first etch 110 process. FIG. 2D shows the S/D contact trenches 240 after first etch 110 is complete, in accordance with one example embodiment. Note that first etch 110 does not remove (or does not completely remove) sacrificial protective layer 220, in this example embodiment.

Figure 2E:
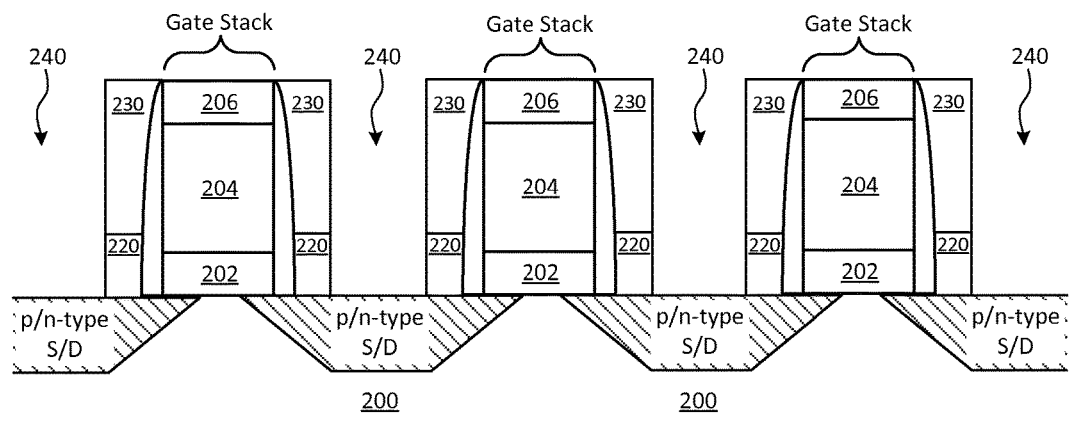
Figure 2F:
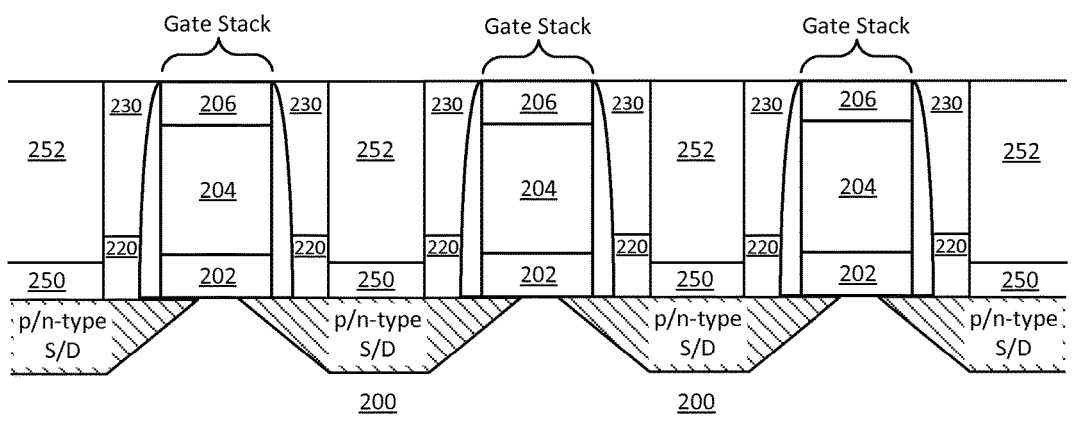

The method continues with a second etch 112 to selectively remove sacrificial protective layer 220 from the S/D contact trenches 240 and to expose the S/D surface layer. As previously described, the type of etchant used to remove sacrificial protective layer 220 can be determined based on the material(s) used for sacrificial protective layer 220, as well as the insulator layer 230 material(s) and the S/D material(s). For example, a Ge sacrificial protective layer can be selectively removed using ozonated water. As shown in FIG. 2E, after second etch 112 has been performed, S/D contact trenches extend down to the S/D surface layer. Note, the etchant used in second etch 112 is compatible with processing at S/D contact trench locations 240, since the etchant does not significantly remove S/D material or insulator material at those locations. After sacrificial protective layer 220 has been removed by second etch 112, the exposed S/D surface layer should be significantly free from contamination or at least be less contaminated than if sacrificial protective layer 220 had not been used. Also note that sacrificial protective layer 220 may still be present under insulator layer 230 in the S/D regions that were not opened by etches 110 and 112, which formed the S/D contact trenches with the exposed S/D surface layer. In other embodiments, the sacrificial protective layer 220 is selectively deposited only where the contact will be formed. Other variations will be apparent in light of this disclosure.

The method then continues with depositing 112 one or more contact layers in S/D contact trenches 240. The embodiment shown in FIG. 2F includes contact resistance reducing metal 250 and contact plugs 252. Contact resistance reducing metal 250 may include silver, nickel, aluminum, titanium, gold, gold-germanium, nickel-platinum, nickel-aluminum, and/or other such resistance reducing metals or alloys. Contact resistance reducing metal may be deposited with or without annealing. Contact plug metal 252 may include aluminum, tungsten, silver, nickel-platinum or nickel-aluminum or other alloys of nickel and aluminum, titanium, or any other suitably conductive contact metal or alloys. In other embodiments, additional semiconducting layers may be deposited before the deposition of contact metal 250 (with or without annealing). In some embodiments additional layers, such as adhesion layers, may be deposited between the contact layers (e.g., between 250 and 252), if so desired.

Non-Planar Configuration

A non-planar architecture can be implemented, for instance, using finned (e.g., tri-gate or FinFET) or nanowire/nanoribbon configurations. Finned configurations include a transistor built around a thin strip of semiconductor material (generally referred to as the fin). The transistor includes the standard field effect transistor (FET) nodes, including a gate, a gate dielectric, a source region, and a drain region. The conductive channel of the device resides on/within the outer sides of the fin beneath the gate dielectric. Specifically, current runs along both sidewalls of the fin (sides perpendicular to the substrate surface) as well as along the top of the fin (side parallel to the substrate surface). Because the conductive channel of such configurations essentially resides along the three different outer, planar regions of the fin, such configurations have been termed as FinFET and tri-gate transistors. Other types of finned configurations can also be used, such as so-called double-gate FinFETs, in which the conductive channel principally resides only along the two sidewalls of the fin (and not along the top of the fin, for example). Nanowire/nanoribbon transistor configurations (sometimes referred to as gate-all-around (GAA) FET) are configured very similarly, but instead of a fin structure, nanowires/nanoribbons (e.g., made from silicon, germanium, or silicon-germanium material) are used and the gate material generally surrounds the channel region on all sides. Depending on the particular design, nanowire/nanoribbon transistors may have, for instance, four effective gates.

Figure 3A:
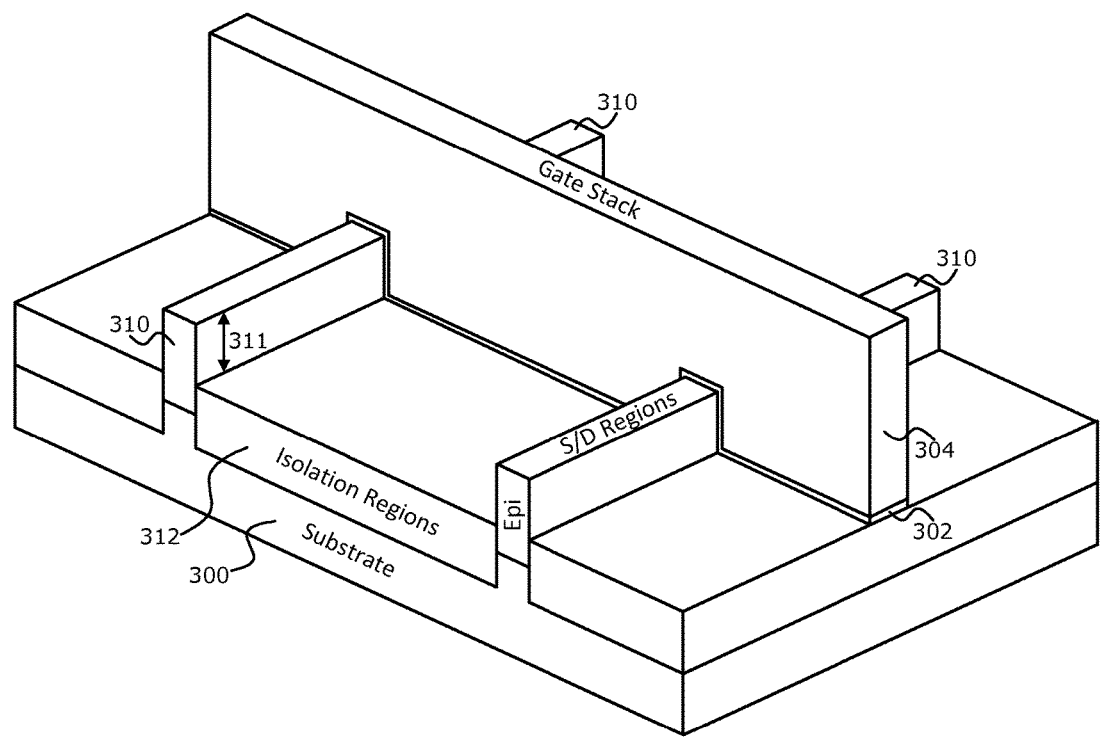
FIGS. 3A-E' illustrate example structures that are formed as the method of FIG. 1 is carried out for non-planar transistor architectures, in accordance with one or more embodiments.

The method for fabricating a transistor structure using a sacrificial protective layer at the contact location of the S/D region as illustrated in FIG. 1 can be applied to non-planar transistor architectures. FIGS. 3A-E' illustrate example structures that are formed as the method of FIG. 1 is carried out for non-planar transistor architectures, in accordance with one or more embodiments. Specifically, FIGS. 3A-E each show a perspective view of an example finned transistor structure and FIG. 3E' shows a perspective view of an example single nanowire/nanoribbon transistor structure. As can be seen in FIG. 3A, the example non-planar configuration shown is implemented with a finned structure, such as a tri-gate configuration. Conventional processes and forming techniques can be used to fabricate the finned structure shown in FIG. 3A, which includes substrate 300 having fins extending from substrate 300 through isolation regions 312. The previous discussion with respect to substrate 200 in FIG. 2A is equally applicable here (e.g., substrate 300 may be a silicon substrate, or XOI substrate such as an SOI substrate, or a multi-layered substrate). The isolation regions 312 can be made from any suitable dielectric/insulative material, such as silicon dioxide.

As can also be seen in FIG. 3A, the S/D regions 310 and gate stack (including dielectric layer 302 and gate electrode 304) have already been formed (e.g., 102 and 104 from the method shown in FIG. 1). The S/D regions and gate stack may be formed using any suitable techniques, including the techniques described above with reference to FIG. 2A. In this example embodiment, the S/D regions 310 are a part of the fin formed from the material of substrate 300. However, in other embodiments, the S/D regions may be formed using a replacement process (e.g., etching, epitaxy deposition, etc.), or some other suitable process. Only two S/D regions are shown, but numerous such regions can be implemented in a similar fashion. Note that the S/D regions may be p-type or n-type or, in some embodiments, both p-type and n-type S/D regions may be included (e.g., where isolation regions 312 are shallow trench isolation (STI) regions used to separate the p-type and n-type S/D regions). Also note that the example shape of the S/D regions 310 shown in FIG. 3A is not intended to limit the present disclosure to any particular S/D types or formation processes, and other suitable S/D shapes (both p and n) may be used (e.g., round, square, rectangular, triangular, etc.). Further note that gate sidewall spacers (not shown) may be formed on opposite sidewalls of the gate stack and that an optional hard mask (not shown) may also be formed on top of gate electrode 304. Note that an alternative to the tri-gate configuration is a double-gate architecture, which includes a dielectric/isolation layer on top of the fin in the gate stack region, for example. Another alternative is a nanowire/nanoribbon configuration, as described below with reference to FIG. 3E'.

Figure 3B:
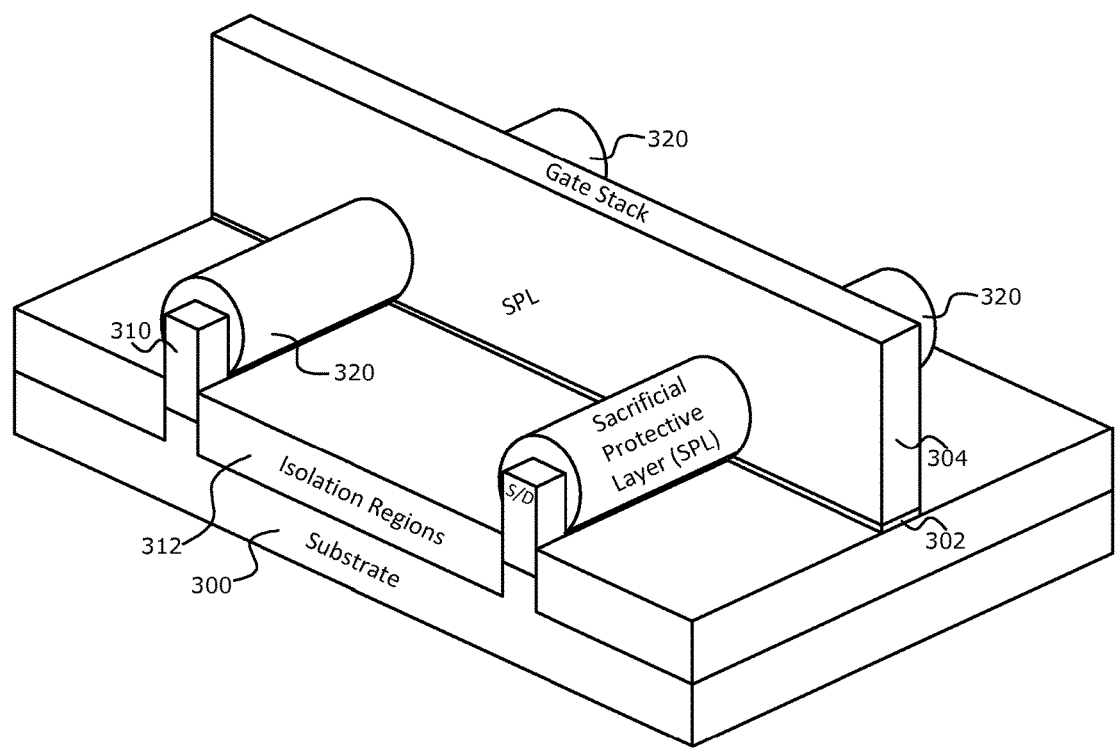
Figure 3C:
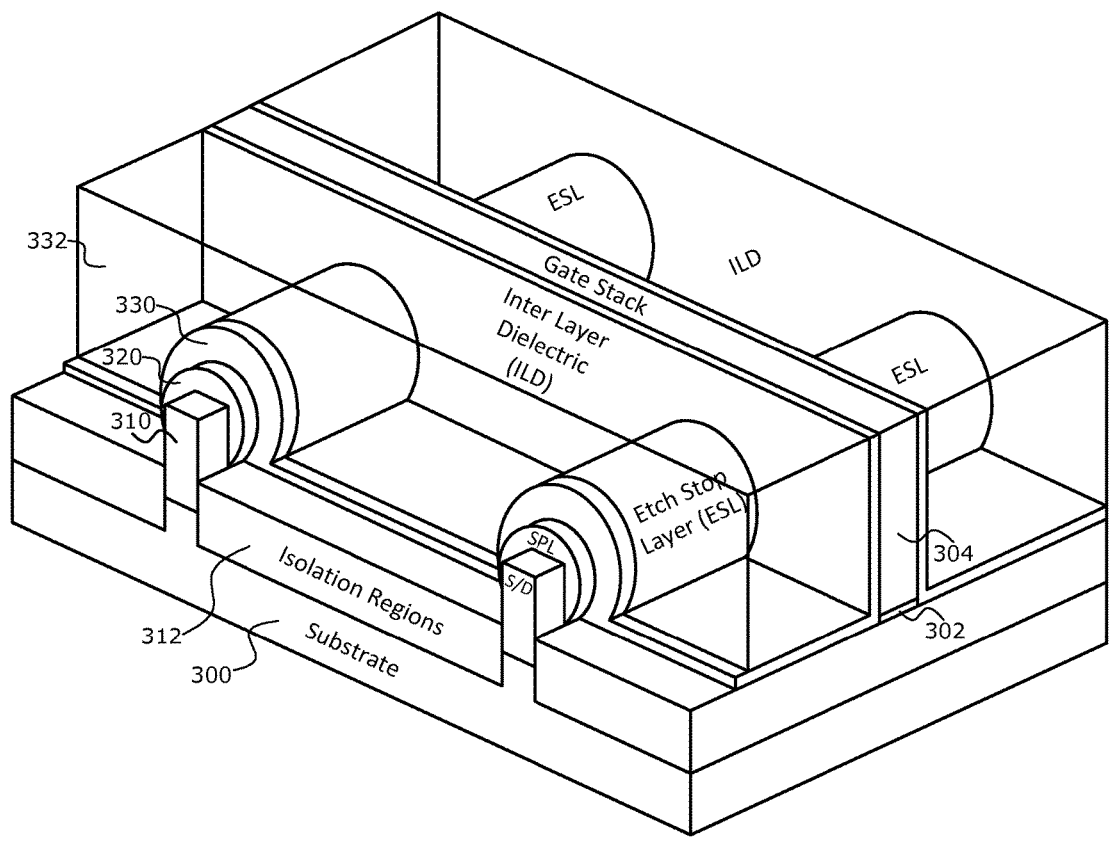

Continuing with the method of FIG. 1, sacrificial protective layer (SPL) 320 is selectively deposited 106 on S/D regions 310, as shown in FIG. 3B. The previous discussion with respect to sacrificial protective layer 220 above is equally applicable here. Note that in this example embodiment, where S/D regions 310 are finned, sacrificial protective layer 320 is completely covering the finned S/D regions 310 down to the isolation regions 312. The method continues with depositing 108 one or more insulator layers, which, in this example embodiment, includes depositing a first insulating layer, etch stop layer (ESL) 330, and a second insulating layer, inter layer dielectric (ILD) 332. After the deposition of insulating layers 330 and 332, the whole structure may be planarized as shown in FIG. 3C. The previous discussion with respect to insulating layer 230 above is equally applicable here. For example, etch stop layer 330 can be made from any suitable dielectric/insulative material, such as silicon nitride or silicon carbide. Further, inter layer dielectric 332 can also be made from any suitable dielectric/insulative material, such as silicon oxides (which may include carbon or nitrogen as well). Note that inter layer dielectric 332 is shown as transparent in this example embodiment, for illustrative purposes.

Figure 3D:
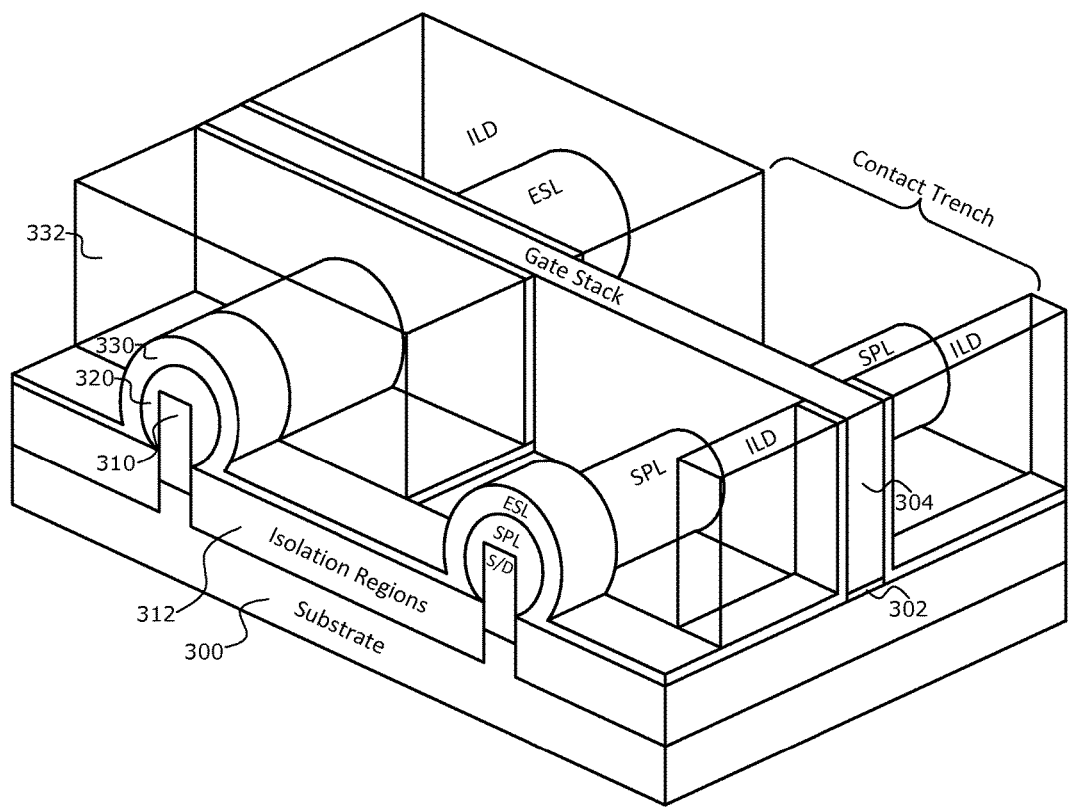

With further reference to the method of FIG. 1, after the insulator layers 330 and 332 have been deposited, a first etch 110 is performed to form S/D contact trenches. FIG. 3D shows the structure after suitable contact patterning and trench etch has been performed. As previously described, first etch 110 does not remove the sacrificial protective layer 320, and thus, at least some sacrificial protective layer 320 can still be seen covering the S/D in the contact trench area shown in FIG. 3D. In one embodiment, the first etch 110 may be a self-aligned process where the etch is selective to the gate sidewall spacers (not shown). In such an embodiment, the S/D contact trenches expose the gate sidewall spacers. This differs from the embodiment shown in FIG. 2D where a portion of the insulator layer 230 remains between the gate sidewall spacer and the S/D contact trench 240 after the etch process.

Figure 3E:
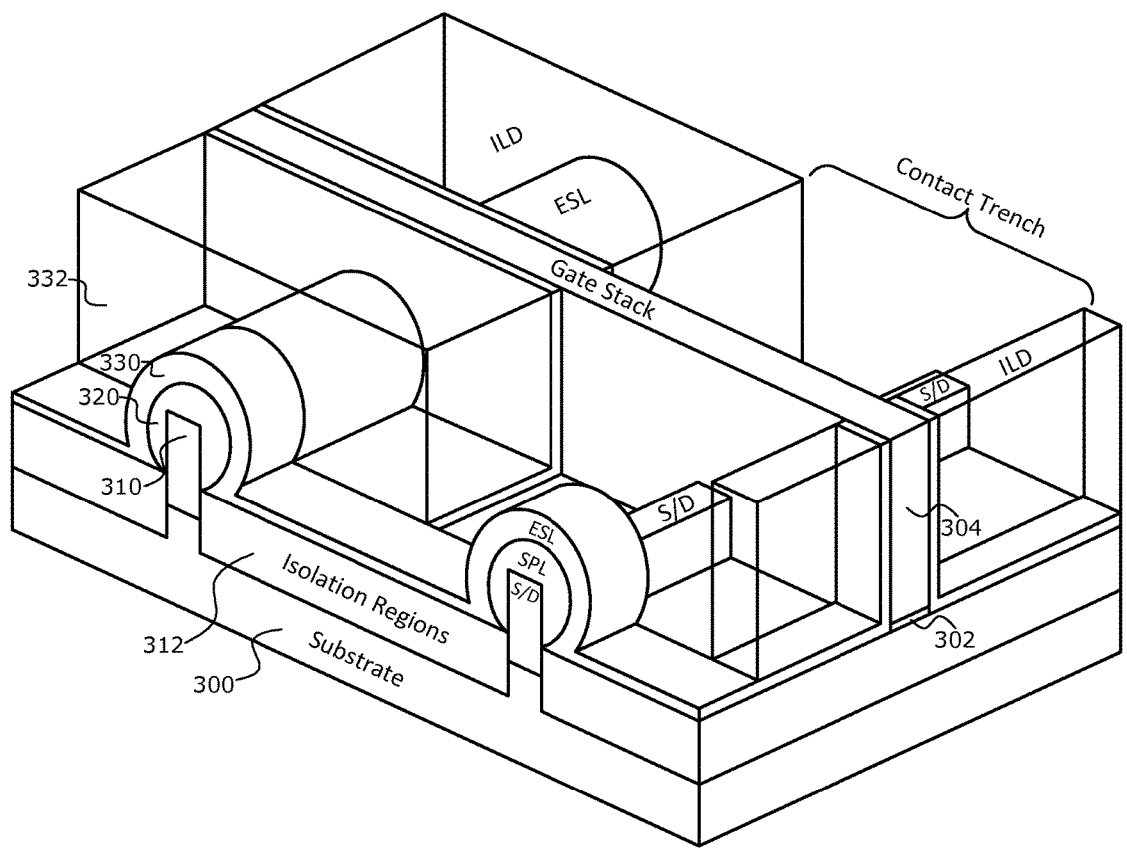
Figure 3E:
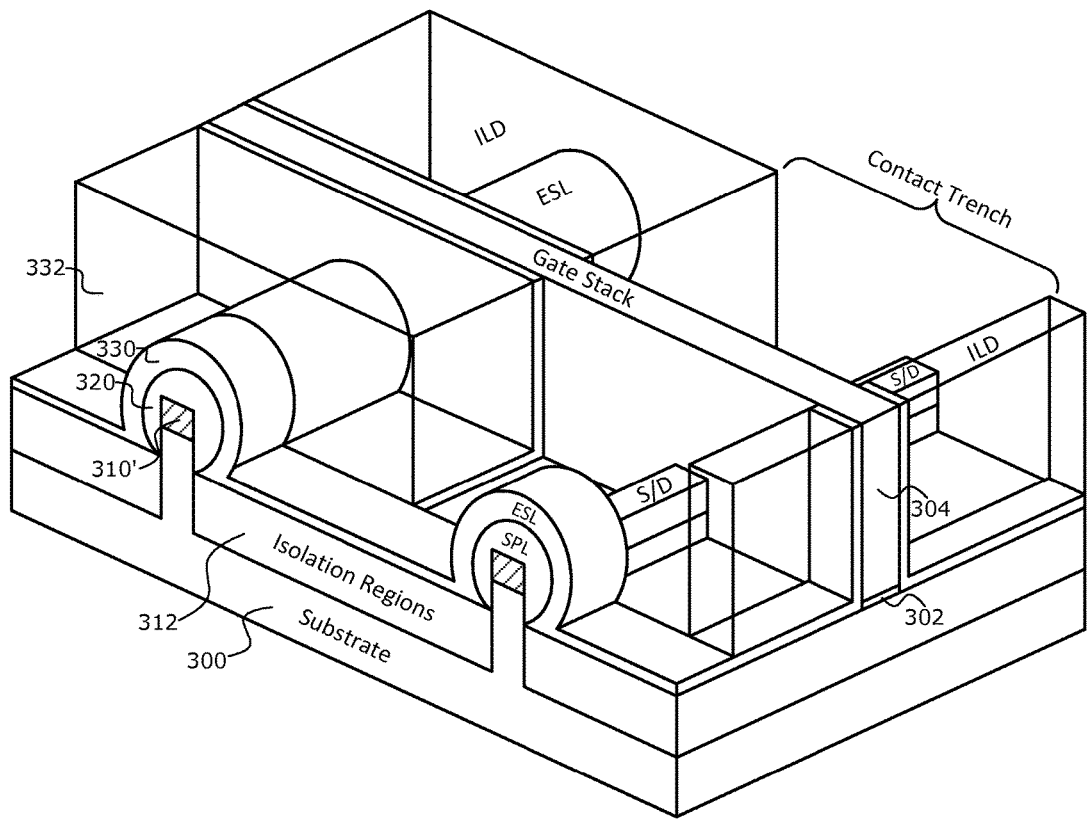

The next step of the method of FIG. 1 is to perform a second etch 112 to selectively remove sacrificial protective layer 320. As can be seen in FIG. 3E, after second etch 112 has been performed to selectively remove the sacrificial protective layer 320, a clean finned S/D contact trench region is exposed for subsequent deposition of one or more contact layers. In this example embodiment, note that sacrificial protective layer 320 remains beneath the insulator layer(s) (e.g., beneath etch stop layer 330) in the areas of the S/D region that were not opened by contact trench etch. The previous discussion with respect to first etch 110, selective second etch 112, and deposition 114 of one or more contact layers in the S/D contact trenches after first and second etch have been performed is equally applicable here. In one embodiment, the second etch 112 may also be a self-aligned process where the etch is selective to the gate sidewall spacers (not shown), thereby exposing the gate sidewall spacer. This differs from the embodiment shown in FIG. 2E where a portion of the sacrificial protective layer 220 remains between the gate sidewall spacer and the S/D contact trench 240 after the etch process.

FIG. 3E' shows the resulting structure after first etch 110 and selective second etch 112 have been performed if a nanowire/nanoribbon transistor architecture was being used. Just as with a fin structure, the S/D regions 310' can be formed from a pedestal of substrate 300 material (from which the nanowires are fabricated) or one or more replacement materials (e.g., silicon, germanium, or silicon-germanium). Therefore, the nanowires/nanoribbons 310' may be grown or otherwise provided, regardless of whether a stack was converted to wires/ribbons or whether a sandwich stack is used where the wires/ribbons alternate with non-active material. In such nanowire/nanoribbon structures, subsequent contact layers may be provided, for instance, around all of the S/D regions or just a portion of the nanowire/nanoribbon 310'. As shown in FIG. 3E', a single nanowire/nanoribbon was grown for each channel, however, any number of nanowires/nanoribbons may be used. Also note that nanowire/nanoribbon S/D regions 310' may be p-type and/or n-type. As can be seen in FIG. 3E', after selective second etch 112 has been performed to remove the sacrificial protective layer 320, a clean nanowire/nanoribbon S/D contact trench region is exposed for subsequent deposition of one or more contact layers. Again, note that sacrificial protective layer 320 remains beneath the insulator layer(s) (e.g., beneath etch stop layer 330) in the areas of the S/D region that were not opened by contact trench etch, in this example embodiment.

The nature of the contact trench etch process (referred to as first etch 110 herein) is that it can remove insulator layers effectively from horizontal surfaces, but is not very effective at otherwise clearing insulator. This is an issue with non-planar transistor structures, because contact trench etch is not very effective at clearing insulator from the sides of or around structures, such as from the sides of raised or finned S/D regions or from around nanowire/nanoribbon S/D regions. For example, using the non-planar transistor structures shown in FIGS. 3A-E', if sacrificial protective layer 320 had not been used and the insulator layer (e.g., etch stop layer 330 in this example case) was deposited directly on the S/D regions 310, then the contact trench etch may not have fully removed all of the insulator layer from the contact locations of the S/D regions 310, such as from the fin sidewalls or from the nanowires/nanoribbons. In such cases, the residual insulator reduces effective contact area, thereby increasing contact resistance and preventing good contact. Using sacrificial protective layer 320 during transistor fabrication can help prevent unwanted residual insulator from remaining on the fin sidewalls or nanowires/nanoribbons, for example. Further, the increased effective contact area that is attained (and thus the gain realized) from using a sacrificial protective layer during transistor fabrication improves as fin height is increased (fin height 311 is shown in FIG. 3A) or as more layers of nanowires/nanoribbons are used. This leads to an improvement in transistor performance.

Example System

Figure 4:
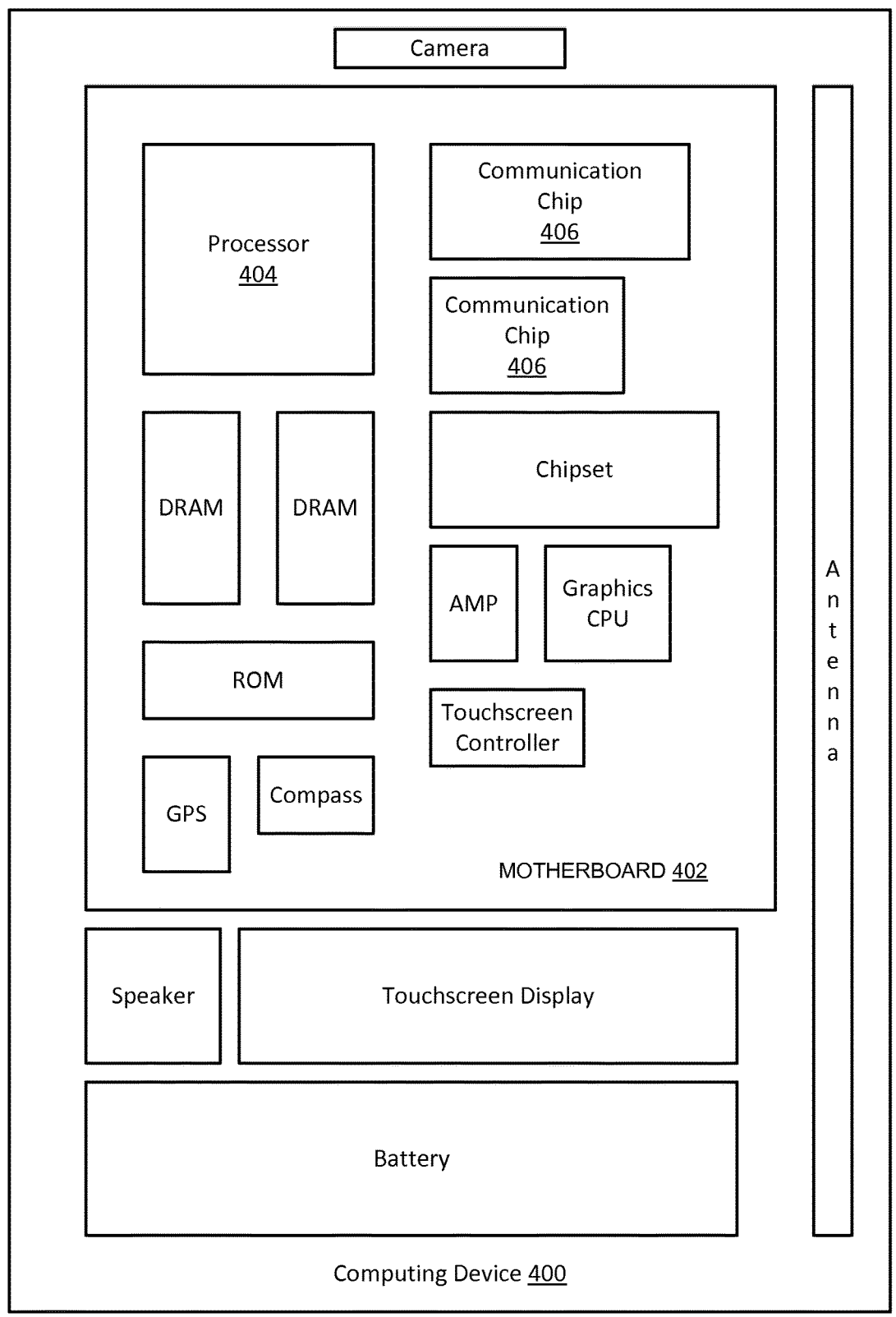
FIG. 4 illustrates a computing system implemented with one or more transistor structures configured in accordance with an example embodiment.

FIG. 4 illustrates a computing system 400 implemented with one or more transistor structures configured in accordance with an example embodiment. As can be seen, the computing system 400 houses a motherboard 402. The motherboard 402 may include a number of components, including but not limited to a processor 404 and at least one communication chip 406, each of which can be physically and electrically coupled to the motherboard 402, or otherwise integrated therein. As will be appreciated, the motherboard 402 may be, for example, any printed circuit board, whether a main board or a daughterboard mounted on a main board or the only board of system 400, etc. Depending on its applications, computing system 400 may include one or more other components that may or may not be physically and electrically coupled to the motherboard 402. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as a hard disk drive, compact disk (CD), digital versatile disk (DVD), and so forth). Any of the components included in computing system 400 may include one or more transistor structures as variously described herein (e.g., a transistor fabricated using a sacrificial protective layer at the contact locations of the S/D regions). These transistor structures can be used, for instance, to implement an on-board processor cache or memory array. In some embodiments, multiple functions can be integrated into one or more chips (e.g., for instance, note that the communication chip 406 can be part of or otherwise integrated into the processor 404).

The communication chip 406 enables wireless communications for the transfer of data to and from the computing system 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 400 may include a plurality of communication chips 406. For instance, a first communication chip 406 may be dedicated to shorter range wireless communications such as NFC, Wi-Fi, and Bluetooth, and a second communication chip 406 may be dedicated to longer range wireless communications such as GPS, EDGE, GPRS, CDMA, WiMAX, LTE, Ev-DO, and others.

The processor 404 of the computing system 400 includes an integrated circuit die packaged within the processor 404. In some embodiments, the integrated circuit die of the processor includes onboard memory circuitry that is implemented with one or more transistor structures as variously described herein. The term "processor" may refer to any device or portion of a device that processes, for instance, electronic data from registers and/or memory to transform that electronic data into other electronic data that may be stored in registers and/or memory.

The communication chip 406 may also include an integrated circuit die packaged within the communication chip 406. In accordance with some such example embodiments, the integrated circuit die of the communication chip includes one or more devices implemented with one or more transistor structures as variously described herein (e.g., on-chip processor or memory). As will be appreciated in light of this disclosure, note that multi-standard wireless capability may be integrated directly into the processor 404 (e.g., where functionality of any chips 406 is integrated into processor 404, rather than having separate communication chips). Further note that processor 404 may be a chip set having such wireless capability. In short, any number of processor 404 and/or communication chips 406 can be used. Likewise, any one chip or chip set can have multiple functions integrated therein.

In various implementations, the computing system 400 may be a laptop, a netbook, a notebook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the system 400 may be any other electronic device that processes data or employs one or more transistor devices as variously described herein.

Further Example Embodiments

The following examples pertain to further embodiments, from which numerous permutations and configurations will be apparent.

Example 1 is a semiconductor device, comprising: a substrate having a number of channel regions; source/drain regions on the substrate and adjacent to a corresponding channel region; a gate region above each channel region and between the source/drain regions; a sacrificial protective layer on a portion of the source/drain regions; at least one insulator layer over the sacrificial protective layer; trench contact areas in the source/drain regions, wherein the sacrificial protective layer is absent from the trench contact areas; and at least one contact layer in the trench contact areas of the source/drain regions.

Example 2 includes the subject matter of any of Examples 1 and 3-18, wherein the sacrificial protective layer material is germanium (Ge).

Example 3 includes the subject matter of any of Examples 1-2 and 4-18, wherein the sacrificial protective layer material includes at least one of titanium (Ti), cobalt (Co), and aluminum oxide ($Al_2O_3$).

Example 4 includes the subject matter of any of Examples 1-3 and 5-18, wherein the sacrificial protective layer material includes at least one of boron nitride (BN) and spin-on carbon hardmask (CHM).

Example 5 includes the subject matter of any of Examples 1-4 and 7-19, wherein the sacrificial protective layer material has an etch rate that is at least 3× greater than the corresponding etch rate of the at least one insulator layer and S/D regions, for a given etch chemistry.

Example 6 includes the subject matter of any of Examples 1-4 and 7-19, wherein the sacrificial protective layer material has an etch rate that is at least 10× greater than the corresponding etch rate of the at least one insulator layer and S/D regions, for a given etch chemistry.

Example 7 includes the subject matter of any of Examples 1-6 and 8-19, wherein the sacrificial protective layer material has a high etch rate in chemistry that does not remove more than 15% of thickness of the source/drain regions or the at least one insulator layer.

Example 8 includes the subject matter of any of Examples 1-7 and 9-19, wherein the sacrificial protective layer is less than 100 angstroms thick.

Example 9 includes the subject matter of any of Examples 1-8 and 10-19, wherein each gate region includes a gate stack configured with a gate electrode and a gate dielectric between the gate electrode and a corresponding channel region.

Example 10 includes the subject matter of any of Examples 1-9 and 11-19, wherein the at least one insulator layer comprises a silicon compound.

Example 11 includes the subject matter of any of Examples 1-10 and 14-17, wherein the device is a planar transistor.

Example 12 includes the subject matter of any of Examples 1-10 and 13-19, wherein the device is a non-planar transistor.

Example 13 includes the subject matter of Example 12 wherein the source/drain regions are implemented in a fin structure having opposing sidewalls and a top, and the at least one insulator layer is not on the sidewalls of the fin.

Example 14 includes the subject matter of any of Examples 1-13 and 15-19, wherein the source/drain regions are free of contamination from the at least one insulator layer.

Example 15 is a mobile computing system comprising the semiconductor device of any of Examples 1-14 and 16-19.

Example 16 is an integrated circuit comprising the semiconductor device of any of Examples 1-14 and 17-19.

Example 17 includes the subject matter of Example 16, wherein the integrated circuit is a processor or a communication chip.

Example 18 is a semiconductor device, comprising: a fin on a substrate, the fin comprising a semiconductor material and having a channel region and corresponding source/drain regions adjacent thereto; a gate region above the channel region and between the source/drain regions; a sacrificial protective layer on a portion of the source/drain regions; at least one insulator layer over the sacrificial protective layer; trench contact areas in the source/drain regions, wherein the sacrificial protective layer is absent from the trench contact areas; and at least one contact layer in the trench contact areas of the source/drain regions.

Example 19 includes the subject matter of any of Examples 1, 5-10, 12-14, and 18, wherein the sacrificial protective layer material includes at least one of germanium (Ge), titanium (Ti), cobalt (Co), aluminum oxide ($Al_2O_3$), boron nitride (BN), and spin-on carbon hardmask (CHM).

Example 20 is method for forming a semiconductor device, comprising: depositing a sacrificial protective layer on at least a portion of source/drain regions provisioned on a substrate adjacent to a corresponding channel region; depositing at least one insulator layer over the sacrificial protective layer; performing a first etch to form source/drain contact trenches; performing a selective etch to remove the sacrificial protective layer from the source/drain contact trenches; and depositing at least one contact layer in the source/drain contact trenches.

Example 21 includes the subject matter of any of Examples 20 and 23-36, wherein the sacrificial protective layer material has an etch rate that is at least 3× greater than the corresponding etch rate of the at least one insulator layer and S/D regions, for a given etch chemistry.

Example 22 includes the subject matter of any of Examples 20 and 23-36, wherein the sacrificial protective layer material has an etch rate that is at least 10× greater than the corresponding etch rate of the at least one insulator layer and S/D regions, for a given etch chemistry.

Example 23 includes the subject matter of any of Examples 20-22 and 24-36, wherein the sacrificial protective layer material has a high etch rate in chemistry that does not remove more than 15% of thickness of the source/drain regions or the at least one insulator layer.

Example 24 includes the subject matter of any of Examples 20-23 and 25-36, wherein the sacrificial protective layer is less than 100 angstroms thick.

Example 25 includes the subject matter of any of Examples 20-24 and 26-36, wherein the at least one insulator layer comprises a silicon compound.

Example 26 includes the subject matter of any of Examples 20-25 and 29-36, wherein the device is a planar transistor.

Example 27 includes the subject matter of any of Examples 20-25 and 28-36, wherein the device is a non-planar transistor.

Example 28 includes the subject matter of Example 27 wherein the source/drain regions are implemented in a fin structure having opposing sidewalls and a top, and the at least one insulator layer is not on the sidewalls of the fin.

Example 29 includes the subject matter of any of Examples 20-28 and 30-36, wherein the source/drain regions are free of contamination from the at least one insulator layer.

Example 30 includes the subject matter of any of Examples 20-29 and 31-36, further comprising forming a gate stack between the source/drain regions configured with a gate electrode and a gate dielectric between the gate electrode and a corresponding channel region.

Example 31 includes the subject matter of any of Examples 20-30 and 32-33, wherein the sacrificial protective layer material includes germanium (Ge).

Example 32 includes the subject matter of any of Examples 20-31 and 33, wherein the sacrificial protective layer material includes at least one of titanium (Ti), cobalt (Co), and aluminum oxide ($Al_2O_3$).

Example 33 includes the subject matter of any of Examples 20-32, wherein the sacrificial protective layer material includes at least one of boron nitride (BN) and spin-on carbon hardmask (CHM).

Example 34 includes the subject matter of Example 31, wherein the selective etch includes using at least one of ozonated water, peroxide, sulfuric acid, nitric acid, and ash processing.

Example 35 includes the subject matter of Example 32, wherein the selective etch includes using a strong sulfuric acid.

Example 36 includes the subject matter of Example 33, wherein the selective etch includes an ash process that may or may not be followed by an optional sulfuric clean.

Example 37 includes the subject matter of any of Examples 20-36, wherein the sacrificial protective layer is selectively deposited on at least a portion of source/drain surfaces and not on insulator surfaces.

Example 38 includes the subject matter of any of Examples 20-36, wherein the sacrificial protective layer is non-selectively deposited on all surfaces.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously or otherwise demonstrated disclosed herein.

What is claimed is:
1. An integrated circuit, comprising:
  a substrate; and
  a transistor including:
    a channel region;
    source and drain (source/drain) regions at least one of in and on the substrate, wherein the channel region is between the source/drain regions;
    a gate region above the channel region;
    a sacrificial protective layer substantially only on the source/drain regions, the sacrificial protective layer including germanium, wherein the sacrificial protective layer is directly on the source/drain regions such that the germanium included in the sacrificial protective layer is directly on the source/drain regions;

an insulator layer over the sacrificial protective layer, wherein the sacrificial protective layer material is different than the insulator layer material;

trench contact areas above the source/drain regions, wherein the sacrificial protective layer is absent from the trench contact areas; and at least one contact layer in the trench contact areas above the source/drain regions.

2. The integrated circuit of claim 1 wherein the sacrificial protective layer material only includes germanium (Ge).

3. The integrated circuit of claim 1 wherein the sacrificial protective layer material has an etch rate that is at least 3× greater than the corresponding etch rate of the insulator layer and S/D regions, for a given etch chemistry.

4. The integrated circuit of claim 1 wherein the sacrificial protective layer material has an etch rate that is at least 10× greater than the corresponding etch rate of the insulator layer and S/D regions, for a given etch chemistry.

5. The integrated circuit of claim 1 wherein the sacrificial protective layer is only on the source/drain regions.

6. The integrated circuit of claim 1 wherein the sacrificial protective layer is less than 100 angstroms thick.

7. The integrated circuit of claim 1 wherein the gate region includes a gate stack configured with a gate electrode and a gate dielectric between the gate electrode and the channel region.

8. The integrated circuit of claim 1 wherein the insulator layer comprises a silicon compound.

9. The integrated circuit of claim 1 wherein the transistor is a planar transistor.

10. The integrated circuit of claim 1 wherein the transistor is a non-planar transistor.

11. The integrated circuit of claim 10 wherein the source/drain regions are implemented in a fin structure having opposing sidewalls and a top, and the insulator layer is not on the sidewalls of the fin.

12. A computing system comprising the integrated circuit of claim 1.

13. A semiconductor device, comprising:

a fin on a substrate, the fin including semiconductor material, wherein the fin includes source and drain (source/drain) regions and a channel region between the source/drain regions;

a gate region above the channel region;

a sacrificial protective layer substantially only on the source/drain regions, the sacrificial protective layer including germanium, wherein the sacrificial protective layer is directly on the source/drain regions such that the germanium included in the sacrificial protective layer is directly on the source/drain regions;

an insulator layer over the sacrificial protective layer, wherein the sacrificial protective layer material is different than the insulator layer material;

trench contact areas above the source/drain regions, wherein the sacrificial protective layer is absent from the trench contact areas; and at least one contact layer in the trench contact areas above the source/drain regions.

14. The device of claim 13 wherein the sacrificial protective layer material only includes germanium (Ge).

15. A method for forming an integrated circuit, comprising:

selectively depositing a sacrificial protective layer substantially only on source and drain (source/drain) regions provisioned at least one of in and on a substrate, the sacrificial protective layer including germanium, wherein a channel region is between the source/drain regions, and wherein the sacrificial protective layer is directly on the source/drain regions such that the germanium included in the sacrificial protective layer is directly on the source/drain regions;

depositing an insulator layer over the sacrificial protective layer, wherein the sacrificial protective layer material is different than the insulator layer material;

performing a first etch to form source/drain contact trenches in the insulator layer material;

performing a selective etch to remove the sacrificial protective layer through the source/drain contact trenches; and depositing at least one contact layer directly on the source/drain regions in the source/drain contact trenches.

16. The method of claim 15 wherein the sacrificial protective layer material only includes germanium (Ge).

17. The method of claim 16 wherein the selective etch includes using at least one of ozonated water, peroxide, sulfuric acid, nitric acid, and ash processing.

18. The method of claim 15 wherein the sacrificial protective layer is selectively deposited only on source/drain surfaces and not on insulator surfaces.

19. The method of claim 18 wherein the sacrificial protective layer is selectively deposited using a mask to prevent deposition of the sacrificial protective layer on surfaces other than the source/drain surfaces.

* * * * *